(12) United States Patent
Naslund et al.

(10) Patent No.: US 10,830,657 B2
(45) Date of Patent: Nov. 10, 2020

(54) LOW PROFILE PRESSURE SENSOR ON THE BODY OF A VEHICLE

(71) Applicant: Rosemount Aerospace Inc., Burnsville, MN (US)

(72) Inventors: Brian Brent Naslund, Chanhassen, MN (US); Peter Mann-Lai Chong, Lakeville, MN (US); Marcus Allen Childress, Farmington, MN (US); Benjamin John Langemo, Shakopee, MN (US)

(73) Assignee: Rosemount Aerospace Inc., Burnsville, MN (US)

( * ) Notice: Subject to any disclaimer, the term of this patent is extended or adjusted under 35 U.S.C. 154(b) by 147 days.

(21) Appl. No.: 16/138,515

(22) Filed: Sep. 21, 2018

(65) Prior Publication Data
US 2019/0094094 A1 Mar. 28, 2019

Related U.S. Application Data

(60) Provisional application No. 62/562,312, filed on Sep. 22, 2017.

(51) Int. Cl.
*G01L 19/00* (2006.01)
*G01L 19/14* (2006.01)
(Continued)

(52) U.S. Cl.
CPC ........ *G01L 19/0092* (2013.01); *G01L 19/086* (2013.01); *G01L 19/141* (2013.01);
(Continued)

(58) Field of Classification Search
None
See application file for complete search history.

(56) References Cited

U.S. PATENT DOCUMENTS

| 6,134,485 A | 10/2000 | Tanielian et al. |
| 6,253,166 B1 | 6/2001 | Whitmore et al. |
| (Continued) | | |

FOREIGN PATENT DOCUMENTS

| DE | 102014116095 A1 | 6/2015 |
| EP | 0690293 A2 | 1/1996 |
| (Continued) | | |

OTHER PUBLICATIONS

Extended European Search Report for European Patent No. 18195402.5 dated Mar. 1, 2019, 9 pages.

(Continued)

*Primary Examiner* — Natalie Huls
*Assistant Examiner* — Jermaine L Jenkins
(74) *Attorney, Agent, or Firm* — Kinney & Lange, P.A.

(57) ABSTRACT

A sensor is configured to attach to a main body and includes a sensor body, a transducer, a transmitter, and a power source. The sensor body is configured to provide a smooth transition with a surface of the main body. The transducer is positioned within the sensor body and is configured to provide a sensed output. The transmitter is positioned within the sensor body and is configured to transmit the sensed output. The power source is positioned within the sensor body and is configured to provide electrical power to the transducer and the transmitter.

16 Claims, 2 Drawing Sheets

(51) Int. Cl.
  *G01L 19/08* (2006.01)
  *G01M 9/06* (2006.01)
  *H01L 29/84* (2006.01)
  *B64D 43/00* (2006.01)

(52) U.S. Cl.
  CPC .......... *G01L 19/147* (2013.01); *G01L 19/148* (2013.01); *G01M 9/065* (2013.01); *H01L 29/84* (2013.01); *B64D 43/00* (2013.01)

(56) References Cited

U.S. PATENT DOCUMENTS

| | | | |
|---|---|---|---|
| 7,246,518 B2 * | 7/2007 | Ito | B60C 23/0408 340/442 |
| 7,284,418 B2 * | 10/2007 | Yin | B60C 23/0494 340/438 |
| 7,334,467 B1 | 2/2008 | DuPuis | |
| 7,490,793 B2 | 2/2009 | Mackness | |
| 7,656,281 B2 | 2/2010 | Zhou | |
| 7,841,563 B2 | 11/2010 | Goosen et al. | |
| 8,095,251 B2 | 1/2012 | Preaux | |
| 8,527,233 B2 | 9/2013 | McIntyre | |
| 9,334,807 B2 | 5/2016 | deGaribody | |
| 9,909,905 B2 * | 3/2018 | Wong | G01P 13/025 |
| 9,950,576 B2 * | 4/2018 | Arai | B60C 23/0498 |
| 2002/0033051 A1 * | 3/2002 | Shimura | B60C 23/0494 73/756 |
| 2007/0257512 A1 * | 11/2007 | Anderson | B62D 35/00 296/180.1 |
| 2011/0046558 A1 * | 2/2011 | Gravesen | A61M 5/1413 604/180 |
| 2013/0233989 A1 | 9/2013 | Carpenter | |
| 2014/0356165 A1 * | 12/2014 | Xiong | G01M 9/065 416/61 |
| 2015/0128714 A1 * | 5/2015 | Moss | G01L 19/0609 73/726 |
| 2015/0168439 A1 | 6/2015 | Genevrier et al. | |
| 2016/0257397 A1 | 9/2016 | Conners et al. | |
| 2016/0305977 A1 | 10/2016 | Genevrier et al. | |

FOREIGN PATENT DOCUMENTS

| | | |
|---|---|---|
| EP | 1255118 A1 | 11/2002 |
| EP | 2434296 A2 | 3/2012 |
| EP | 3211433 A1 | 8/2017 |
| FR | 2891368 A1 | 3/2007 |
| GB | 2432914 A | 6/2007 |

OTHER PUBLICATIONS

Extended European Search Report for European Patent No. 18195813.3 dated Feb. 22, 2019, 8 pages.

European Office Action for European Patent No. 18195813.3 dated Feb. 5, 2020, 16 pages.

* cited by examiner

LOW PROFILE PRESSURE SENSOR ON THE BODY OF A VEHICLE

CROSS-REFERENCE TO RELATED APPLICATION

This application claims the benefit of U.S. Provisional Application No. 62/562,312 filed Sep. 22, 2017.

BACKGROUND

The present invention relates generally to sensors, and in particular to a low profile, disposable, sensor.

Surface pressure distribution within an external flow field surrounding an aircraft, watercraft, or land vehicle, for example, is a desirable characteristic to measure. Obtaining these measurements accurately and inexpensively, however, can be challenging. Using these measurements to characterize flow fields is especially desirable during vehicle development, so that issues identified during testing may be addressed. Determination of flow fields has often been accomplished using difficult and/or expensive means including testing with wind tunnels. It is desirable to provide a cheaper and more efficient way to obtain measurements to characterize flow fields surrounding airborne, water, and/or land vehicles.

SUMMARY

In an example embodiment, a sensor is configured to attach to a main body and includes a sensor body, a transducer, a transmitter, and a power source. The sensor body is configured to provide a smooth transition with a surface of the main body. The transducer is positioned within the sensor body and is configured to provide a sensed output. The transmitter is positioned within the sensor body and is configured to transmit the sensed output. The power source is positioned within the sensor body and is configured to provide electrical power to the transducer and the transmitter.

In another example embodiment, a method of sensing includes adhering, using an adhesive, a first sensor to a surface, wherein the first sensor includes a sensor body that provides a smooth transition with the surface; sensing, by a transducer, a first sensed value, wherein the transducer is positioned within the sensor body; and transmitting, by an antenna, the first sensed value to a data acquisition unit, wherein the transmitter is positioned within the sensor body.

In another example embodiment, a vehicle system includes a data acquisition unit and a plurality of sensors adhered to an external surface of the vehicle. Each of the plurality of sensors includes a sensor body, a transducer, and a transmitter. The sensor body provides a smooth transition between the external surface of the vehicle and the sensor body. The sensor body does not extend beyond a boundary layer of the vehicle. The transducer is positioned within the sensor body and is configured to obtain a sensed pressure local to the respective sensor, and the transmitter is configured to transmit the sensed pressure to the data acquisition unit.

DETAILED DESCRIPTION

A low profile, disposable, sensor is disclosed herein that may be adhered to an external body of a vehicle. The sensor is shaped such that there is little to no effect on the aerodynamics of the vehicle. The sensor includes a local power source, a transducer, and a transmitter. The sensor may be adhered to the outer surface of the vehicle body using an adhesive, for example. The sensor may be configured to communicate wirelessly, through the transmitter, to a data acquisition unit, for example.

Figure 1:
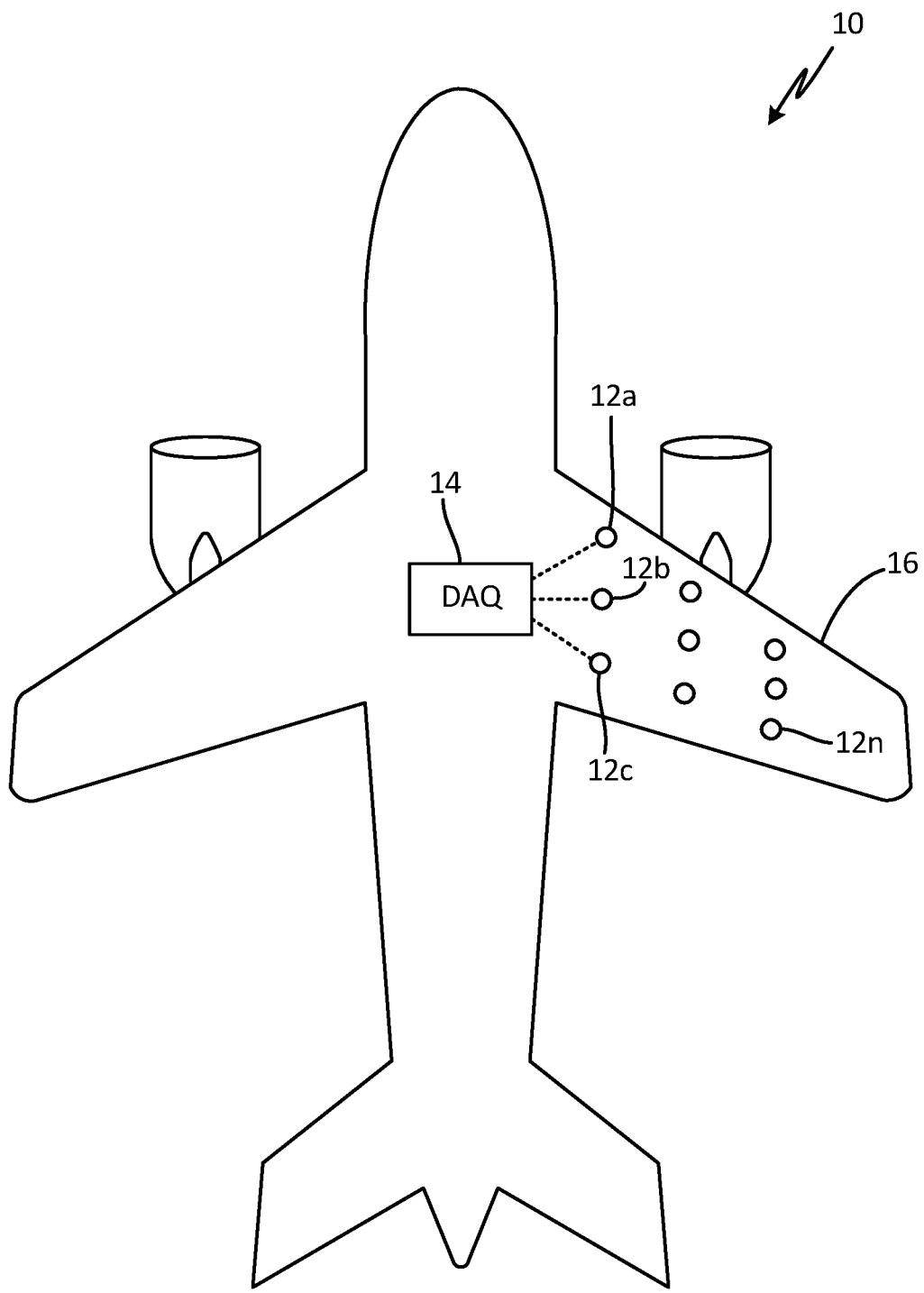
FIG. 1 is a diagram illustrating an aircraft that includes an array of low profile, disposable, sensors.

FIG. 1 is a diagram illustrating aircraft 10 that includes an array of low profile, disposable, sensors 12a-12n. Sensors 12a-12n may be configured to communicate wirelessly with data acquisition unit 14 or any other onboard computer systems. While illustrated as an aircraft in this embodiment, sensors 12a-12n may be adhered to any vehicle such as ground vehicles, watercraft, other types of airborne vehicles, or any other body for which it is desirable to measure an external flow field surrounding the body, or other environment value. In addition to use on vehicle bodies, sensors 12a-12n may also be utilized to measure characteristics of the environment in inaccessible or remote locations. While illustrated on a wing of aircraft 10, sensors 12a-12n may be located at any position on aircraft 10. For example, in other embodiments, aircraft 10 may be a blended wing body aircraft where complete external flow field data may be desired. It may therefore be desirable to implement sensors 12a-12n as low profile pressure sensors across the entire body of the aircraft.

Sensors 12a-12n may be applied externally to body 16 of aircraft 10 on both curved and flat surfaces. While illustrated as an array of sensors 12a-12n, any number of sensors, including a single sensor, may be applied to the skin of aircraft 10. In the embodiment illustrated in FIG. 1, the array of sensors 12a-12n may be pressure sensors configured to communicate wirelessly with data acquisition unit 14. In other embodiments, sensors 12a-12n may be configured to communicate with data acquisition unit 14 over a wired connection, for example.

Each sensor 12a-12n may be configured to sense a local pressure, for example, at the respective point on body 16 of aircraft 10. Thus, the array of sensors 12a-12n may be utilized, for example, to determine a flow field surrounding body 16 of aircraft 10. For example, each sensor 12a-12n may be configured to sense a local pressure and provide the sensed pressure to data acquisition unit 14 at any desired time interval. Data acquisition unit 14, or any other computer system, may then determine a flow field surrounding body 16 of aircraft 10 using the sensed pressures. In other embodiments, sensors 12a-12n may be configured to sense other characteristics of aircraft 10 or the environment. For example, one of sensors 12a-12n may be implemented as a gas detector near an outlet of an engine of aircraft 10 and configured to sense engine byproducts during testing of aircraft 10. In another embodiment, one of sensors 12a-12n may be implemented as an ice accretion detector configured to monitor icing conditions on a control surface of aircraft 10, for example.

In the embodiment for which sensors 12a-12n are pressure sensors, determination of the flow field surrounding aircraft 10 may be desirable, for example, during development and testing of aircraft 10. It may therefore be desirable to only include sensors 12a-12n on body 16 of aircraft 10 during development and testing of aircraft 10. Because of this, sensors 12a-12n may be configured for easy removal following desired use. For example, sensors 12a-12n may be adhered to body 16 of aircraft 10 using an adhesive, magnetics, or some other way of providing temporary attachment of sensors 12a-12n to aircraft 10. Following the desired utilization, sensors 12a-12n may be removed from body 16 of aircraft 10 and disposed of.

Figure 2:
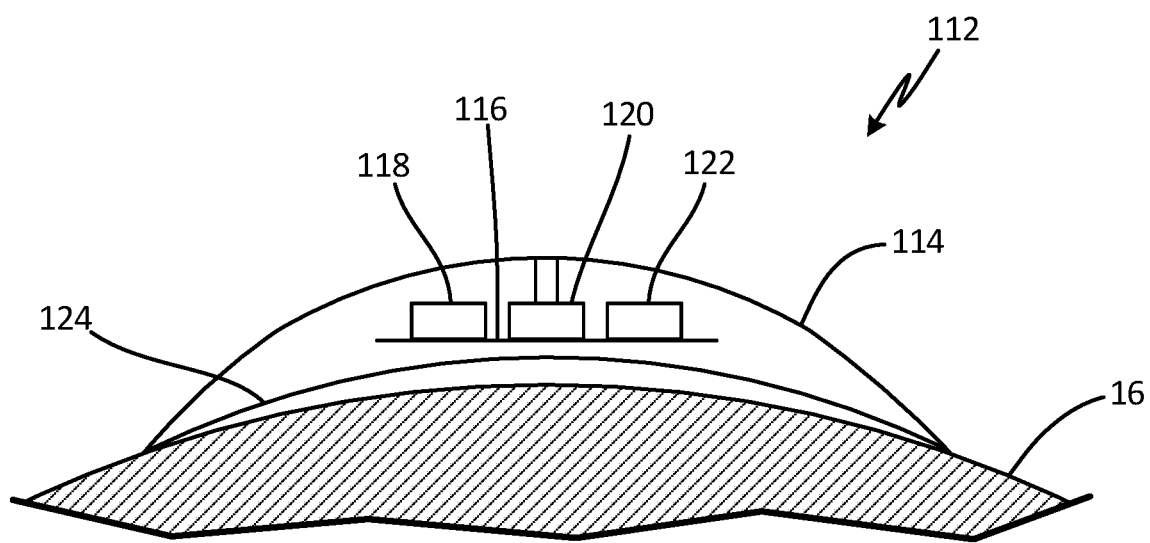
FIG. 2 is a cross-sectional view illustrating an embodiment of a low profile, disposable, sensor.

FIG. 2 is a cross-sectional view illustrating an embodiment of low profile sensor 112. Sensor 112 may be implemented as any of sensors 12a-12n of FIG. 1, for example. Sensor 112 includes sensor body 114, sensor board 116, power source 118, transducer 120, and transmitter 122. Sensor 112 is adhered to aircraft body 16 using adhesive 124. While illustrated as an adhesive, any method of temporarily adhering sensor 112 to aircraft body 16 may be used.

The shape of sensor body 114 may be configured to not disturb the flow field surrounding aircraft 10. As seen in the embodiment shown in FIG. 2, the shape of sensor body 114 is designed so as not to increase drag or otherwise affect the aerodynamics of aircraft 10. For example, sensor body 114 may be implemented as a "bump" or other low-profile shape. The transition from body 16 to sensor body 114 is shaped to provide as low, and as smooth of a transition as possible so as to minimize any aerodynamic effect. For example, the slope from the edge of sensor body 114 to the maximum height of sensor body 114 may be gentle, such that there are no significant breaks with body 16 that may affect the aerodynamics of aircraft 10.

The size of sensor 112 may be such that the entirety of sensor 112 remains within the airflow boundary layer of aircraft 10. This is advantageous in that it allows measurement of the flow field, for example, within the boundary layer of aircraft 10, while having little to no effect on the flow field itself. In an example embodiment, sensor 112 may have a length of 2 inches, a width of 1 inch, and a height of 0.33 inches. However, any other dimensions that maintain sensor 112 within the boundary layer of aircraft 10 may also be utilized.

Transducer 120 may be configured to provide an output indicative of a sensed value local to sensor 112. In one embodiment, transducer 120 may be a pressure transducer configured to sense a pressure local to sensor 112. Transducer 120 may be a silicon based, strain isolated, sensor. For example, transducer 120 may be a strain gauge pressure sensor configured such that an electrical resistance of the gauge is dependent upon the local pressure. An output indicative of the pressure, which may be a voltage, for example, may be provided as an output of transducer 120. Transmitter 122, which may be an antenna, such as a patch antenna, for example, may be configured to wirelessly transmit the voltage or other value output by transducer 120. While described as a transmitter, transmitter 122 may also be configured as a receiver/transmitter such that two-way communication may be achieved with data acquisition unit 14.

The components of sensor 112 may be powered by onboard power source 118. Power source 118 may be a battery, for example, or any other device capable of providing electrical power to transducer 120 and transmitter 122. In another embodiment, an energy harvester may be implemented internal, or external, to sensor 112. The energy harvester may be utilized by itself to provide power to the components of sensor 112, or may be connected to recharge a battery or other power source of sensor 112. Any method of energy harvesting may be employed including, but not limited to, conversion of vibration energy to electrical power, solar energy collection, and conversion of thermal energy to electrical power.

Power source 118 may be configured to provide power to transducer 120 and transmitter 122 through sensor board 116, which may be a circuit board configured to provide electrical connection between elements of sensor 112, for example. Sensor board 116 may also include additional components (not shown) such as a controller circuit, application specific integrated circuit (ASIC), or other circuitry. In the embodiment for which sensor 112 is a pressure sensor, the components of sensor board 116 may be capable of providing, for example, signal conditioning and pressure correction for the output of transducer 120. Thus, transmitter 122 may be capable of providing an accurate pressure reading directly to data acquisition unit 14.

Power source 118 may be sized to fulfill the power needs of sensor 112 for an anticipated lifetime of sensor 112. For example, if sensor 112 is designed for use during testing of aircraft 10, power source 118 may be a battery sized to provide power for the entire test cycle of aircraft 10. The battery may be activated upon installation of sensor 112, and run continuously throughout the entire life of sensor 112. Following use of sensor 112, sensor 112 may be removed from body 16 and disposed of. In applications that require lengthy runtime, an energy harvester, utilizing any method of energy harvesting, may be implemented on aircraft body 16, or internal to sensor body 114, and connected to recharge power source 118.

Low-profile, disposable, sensor 112 provides significant advantages. Because all of the components of sensor 112 are collocated within sensor body 114, sensor 112 provides inherent lightening protection and exhibits minimal electromagnetic interference. Further, sensor body 114 provides media isolation to prevent or minimize foreign object damage (FOD), moisture, and other environmental elements.

In one embodiment, sensor 112 provides an accurate and cost effect method for measuring flow fields for aircraft and other vehicles. Sensors 112 provide air data measurements to data acquisition unit 14. Using these measurements, data acquisition unit 14 may detect flow separation, turbulence, and other aerodynamic phenomena during testing of aircraft 10. These characteristics may be accurately measured due to the minimal effect sensors 112 have on the flow field of aircraft 10. This is in contrast to prior pressure sensing means such as pitot tubes, for example. This way, the use of wind tunnels and other expensive testing means may be reduced or eliminated.

DISCUSSION OF POSSIBLE EMBODIMENTS

The following are non-exclusive descriptions of possible embodiments of the present invention.

A sensor is configured to attach to a main body and includes a sensor body, a transducer, a transmitter, and a power source. The sensor body is configured to provide a smooth transition with a surface of the main body. The transducer is positioned within the sensor body and is configured to provide a sensed output. The transmitter is positioned within the sensor body and is configured to transmit the sensed output. The power source is positioned within the sensor body and is configured to provide electrical power to the transducer and the transmitter.

The sensor of the preceding paragraph can optionally include, additionally and/or alternatively, any one or more of the following features, configurations and/or additional components:

A further embodiment of the foregoing sensor, wherein the sensor body is attached to the main body using an adhesive.

A further embodiment of any of the foregoing sensors, wherein the transmitter is an antenna configured to wirelessly transmit the sensed output to a remote system.

A further embodiment of any of the foregoing sensors, wherein the sensor body does not extend outwardly from the main body beyond an airflow boundary layer of a vehicle that includes the main body, and wherein the smooth transition comprises a gentle slope from the main body such that there is no significant break from the main body.

A further embodiment of any of the foregoing sensors, wherein the power source is a battery, and wherein the transducer, the transmitter, and the power source are connected via a circuit board.

A further embodiment of any of the foregoing sensors, wherein the sensor is a pressure sensor, and where in the sensed value is a local pressure.

A further embodiment of any of the foregoing sensors, wherein the transducer is a silicon based, strain isolated pressure transducer.

An aircraft system includes a plurality of any of the foregoing sensors, wherein the main body is an aircraft body of an aircraft, and a data acquisition unit configured to receive pressure data from each of the transmitters of the plurality of sensors. The data acquisition unit is configured to determine a flow field for the aircraft using the pressure data from the plurality of sensors.

A method of sensing includes adhering, using an adhesive, a first sensor to a surface, wherein the first sensor includes a sensor body that provides a smooth transition with the surface; sensing, by a transducer, a first sensed value to the first sensor, wherein the transducer is positioned within the sensor body; and transmitting, by an antenna, the first sensed value to a data acquisition unit, wherein the transmitter is positioned within the sensor body.

The method of the preceding paragraph can optionally include, additionally and/or alternatively, any one or more of the following features, configurations and/or additional components:

A further embodiment of the foregoing method, further including powering, by a battery, the first sensor, wherein the battery is positioned within the sensor body, and wherein the battery, the transducer, and the antenna are connected via a circuit board.

A further embodiment of any of the foregoing methods, wherein the surface is the surface of a vehicle, the method further includes adhering a plurality of second sensors to the surface; sensing, by each of the plurality of second sensors, respective second sensed values; and transmitting, by each of the plurality of second sensors, the respective second sensed values to the data acquisition unit.

A further embodiment of any of the foregoing methods, wherein the first and second sensed values are respective local pressures, further including determining, by the data acquisition unit, aerodynamic properties of the vehicle using the respective sensed local pressures.

A vehicle system includes a data acquisition unit and a plurality of sensors adhered to an external surface of the vehicle. Each of the plurality of sensors includes a sensor body, a transducer, and a transmitter. The sensor body provides a smooth transition between the external surface of the vehicle and the sensor body. The sensor body does not extend beyond a boundary layer of the vehicle. The transducer is positioned within the sensor body and is configured to obtain a sensed pressure local to the respective sensor, and the transmitter is configured to transmit the sensed pressure to the data acquisition unit.

The system of the preceding paragraph can optionally include, additionally and/or alternatively, any one or more of the following features, configurations and/or additional components:

A further embodiment of the foregoing system, wherein each of the plurality of sensors further comprise a local battery configured to provide power to the transmitter and the transducer.

A further embodiment of any of the foregoing systems, wherein, for each of the plurality of sensors, the local battery, the transducer, and the transmitter are connected via a local circuit board.

A further embodiment of any of the foregoing systems, wherein each of the plurality of sensors are adhered to the external surface of the vehicle using an adhesive, and wherein each of the plurality of sensors are removable from the external surface of the vehicle.

A further embodiment of any of the foregoing systems, wherein the data acquisition unit is configured to determine aerodynamic properties of the vehicle using the sensed pressure from each of the plurality of sensors.

A further embodiment of any of the foregoing systems, wherein the sensor body of each of the plurality of sensors is shaped to not affect local flow conditions at the surface of the vehicle, and wherein the sensor body of each of the plurality of sensors does not extend beyond a boundary layer of the vehicle.

A further embodiment of any of the foregoing systems, wherein the transducer of each of the plurality of sensors is a silicon based strain gauge.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. An aircraft system comprising:
   a plurality of pressure sensors configured to attach to an aircraft body of an aircraft, each of the pressure sensors comprising:
      a sensor body configured to provide a smooth transition with a surface of the aircraft body of the aircraft;
      a transducer positioned within the sensor body and configured to provide local pressure data;
      a transmitter positioned within the sensor body and configured to transmit the local pressure data; and
      a power source positioned within the sensor body and configured to provide electrical power to the transducer and the transmitter; and
   a data acquisition unit configured to receive the local pressure data from each of the transmitters of the plurality of sensors;
   wherein the data acquisition unit is configured to determine a flow field for the aircraft using the local pressure data from the plurality of sensors.

2. The aircraft system of claim 1, wherein the sensor body is attached to the aircraft body of the aircraft using an adhesive.

3. The aircraft system of claim 1, wherein the transmitter is an antenna configured to wirelessly transmit the local pressure data to a remote system.

4. The aircraft system of claim 1, wherein the sensor body does not extend outwardly from the aircraft body of the aircraft beyond an airflow boundary layer of the aircraft, and wherein the smooth transition comprises a gentle slope from the aircraft body of the aircraft such that there is no significant break from the aircraft body of the aircraft.

5. The aircraft system of claim 1, wherein the power source is a battery, and wherein the transducer, the transmitter, and the power source are connected via a circuit board.

6. The aircraft system of claim 1, wherein the transducer is a silicon based, strain isolated pressure transducer.

7. A method of sensing, the method comprising:
adhering, using an adhesive, a first sensor to a surface of a vehicle, wherein the first sensor includes a sensor body that provides a smooth transition with the surface of the vehicle;
adhering a plurality of second sensors to the surface of the vehicle;
sensing, by a transducer, a sensed value, wherein the transducer is positioned within the sensor body of the first sensor;
transmitting, by an antenna, the first sensed value to a data acquisition unit, wherein the transmitter is positioned within the sensor body of the first sensor;
sensing, by each of the plurality of second sensors, respective second sensed values; and
transmitting, by each of the plurality of second sensors, the respective second values to the data acquisition unit.

8. The method of claim 7, further comprising:
powering, by a battery, the first sensor, wherein the battery is positioned within the sensor body, and wherein the battery, the transducer, and the antenna are connected via a circuit board.

9. The method of claim 7, wherein the first and second sensed values are respective local pressures, the method further comprising:
determining, by the data acquisition unit, aerodynamic properties of the vehicle using the first and second sensed values.

10. A vehicle system comprising:
a data acquisition unit; and
a plurality of sensors adhered to an external surface of the vehicle, wherein each of the plurality of sensors comprises:
a sensor body that provides a smooth transition between the external surface of the vehicle and the sensor body, and wherein the sensor body does not extend beyond a boundary layer of the vehicle;
a transducer within the sensor body and configured to obtain a sensed pressure local to the respective sensor; and
a transmitter configured to transmit the sensed pressure to the data acquisition unit.

11. The vehicle system of claim 10, wherein each of the plurality of sensors further comprise a local battery configured to provide power to the transmitter and the transducer.

12. The vehicle system of claim 11, wherein, for each of the plurality of sensors, the local battery, the transducer, and the transmitter are connected via a local circuit board.

13. The vehicle system of claim 10, wherein each of the plurality of sensors are adhered to the external surface of the vehicle using an adhesive, and wherein each of the plurality of sensors are removable from the external surface of the vehicle.

14. The vehicle system of claim 10, wherein the data acquisition unit is configured to determine aerodynamic properties of the vehicle using the sensed pressure from each of the plurality of sensors.

15. The vehicle system of claim 14, wherein the sensor body of each of the plurality of sensors is shaped to not affect local flow conditions at the surface of the vehicle, and wherein the sensor body of each of the plurality of sensors does not extend beyond a boundary layer of the vehicle.

16. The vehicle system of claim 10, wherein the transducer of each of the plurality of sensors is a silicon based strain gauge.

* * * * *